United States Patent [19]
Kimura

[11] Patent Number: 5,578,127
[45] Date of Patent: Nov. 26, 1996

[54] SYSTEM FOR APPLYING PROCESS LIQUID

[75] Inventor: Yoshio Kimura, Kumamoto-ken, Japan

[73] Assignees: Tokyo Electron Ltd; Tokyo Electron Kyushu Ltd., both of Japan

[21] Appl. No.: 574,732

[22] Filed: Dec. 19, 1995

Related U.S. Application Data

[63] Continuation of Ser. No. 192,260, Feb. 7, 1994, abandoned.

[30] Foreign Application Priority Data

Feb. 8, 1993 [JP] Japan .................................. 4-043277

[51] Int. Cl.$^6$ .................... B05B 13/02; B05C 5/00; B05C 13/00
[52] U.S. Cl. .................... 118/695; 118/320; 118/321; 118/323; 118/500; 118/503; 134/90; 134/105; 134/902; 198/468.2
[58] Field of Search .................... 118/695, 697, 118/59, 300, 320, 321, 323, 326, 500, 503, 696; 134/84, 88, 90, 105, 902; 198/468.2, 468.6, 803.14; 414/222, 225, 749, 751; 437/225, 228, 231

[56] References Cited

U.S. PATENT DOCUMENTS

| | | | |
|---|---|---|---|
| 4,418,639 | 12/1983 | Wills et al. | 118/59 |
| 4,722,298 | 2/1988 | Rubin et al. | 414/222 |
| 4,747,928 | 5/1988 | Takahashi et al. | 414/225 |
| 4,789,294 | 12/1988 | Sato et al. | 414/222 |
| 4,982,694 | 1/1991 | Moriyama | 118/697 |
| 4,985,722 | 1/1991 | Ushijima et al. | 134/902 |
| 5,002,008 | 3/1991 | Ushijima et al. | 118/313 |
| 5,061,144 | 10/1991 | Akimoto et al. | 118/500 |
| 5,143,552 | 9/1992 | Moriyama | 118/666 |
| 5,177,514 | 1/1993 | Ushijima et al. | 414/225 |
| 5,211,753 | 5/1993 | Swain | 118/320 |
| 5,250,114 | 10/1993 | Konishi et al. | 118/321 |

FOREIGN PATENT DOCUMENTS

| | | | |
|---|---|---|---|
| 1-204420 | 8/1989 | Japan | 118/300 |
| 1-211919 | 8/1989 | Japan | 118/320 |
| 1-200623 | 8/1989 | Japan | 118/320 |
| 5-144720 | 6/1993 | Japan | 118/320 |

Primary Examiner—Donald E. Czaja
Assistant Examiner—Steven P. Griffin
Attorney, Agent, or Firm—Graham & James LLP

[57] ABSTRACT

A system for coating a photoresist on a semiconductor wafer includes a loading/unloading unit and a process unit. A convey path is arranged in the process unit, and an adhesion process section, a pre-bake section, a cooling section, a resist coating section, and a cover film coating section are arranged along the convey path. The adhesion process section, the pre-bake section, and the cover film coating section are arranged in individual process chambers, while the cooling section and the resist coating section are arranged in a common main process chamber. A convey robot is disposed to be movable along the convey path, and a substrate is conveyed among the process chambers by the convey robot. A convey member is arranged in and dedicated to the main process chamber, and the substrate is conveyed from the cooling section to the-resist coating section by the convey member.

18 Claims, 5 Drawing Sheets

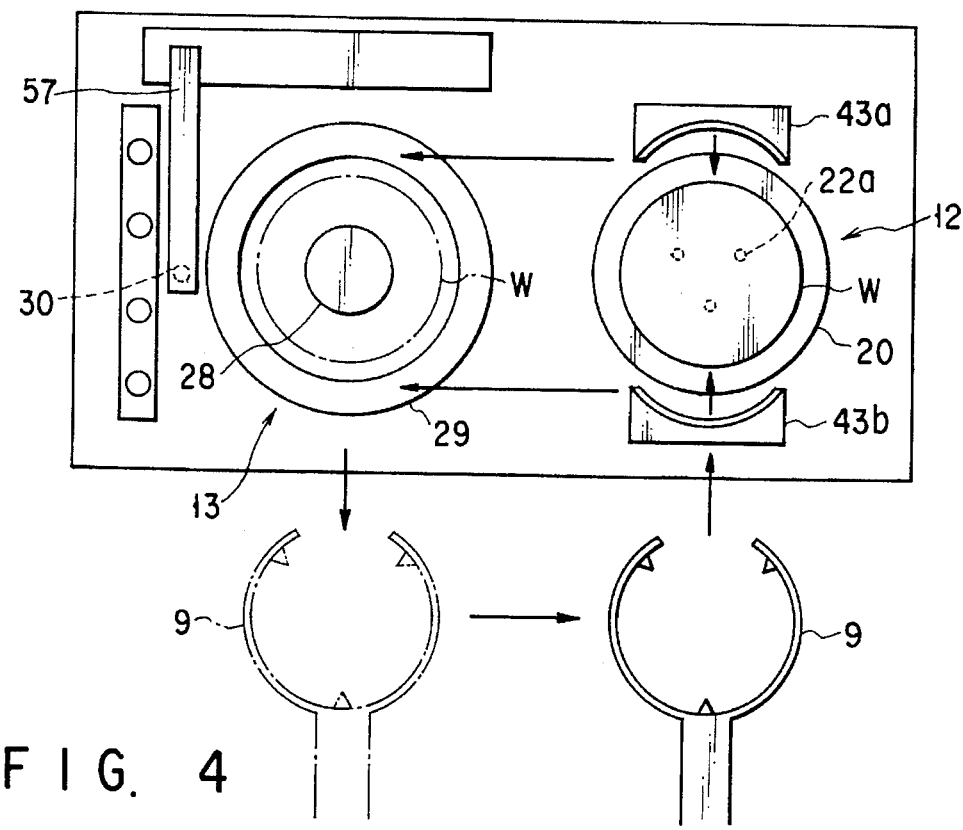
F I G. 4
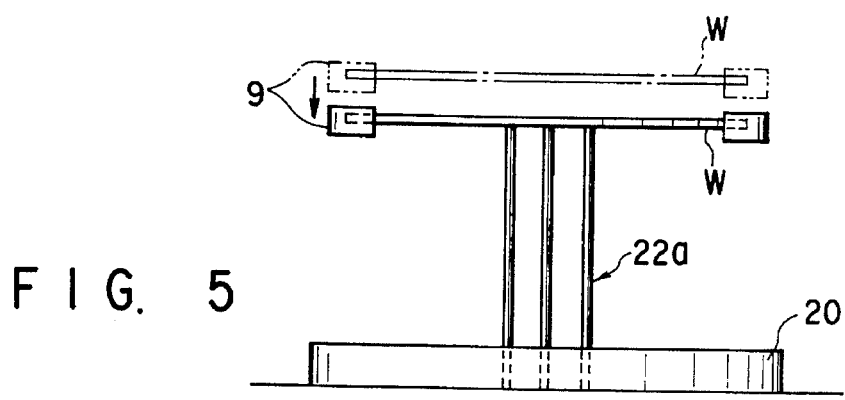
F I G. 5
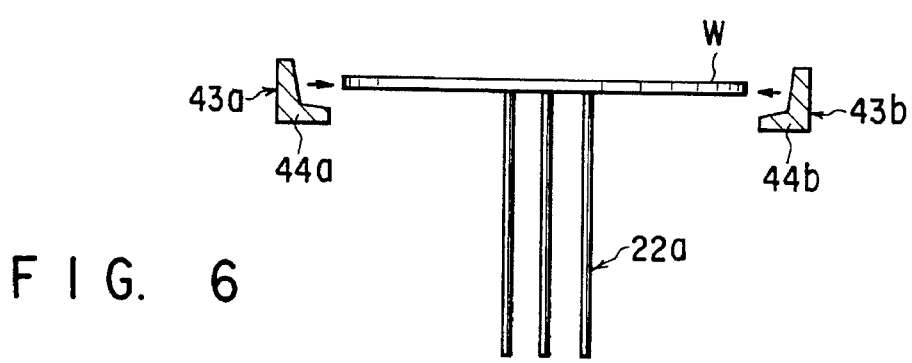
F I G. 6

SYSTEM FOR APPLYING PROCESS LIQUID

This is a continuation of copending application Ser. No. 08/192,260 filed on Feb. 7, 1994, now abandoned.

BACKGROUND OF THE INVENTION

1. Field of the Invention

The present invention relates to a processing system for performing a plurality of processes for a target substrate, e.g., a semiconductor wafer and, more particularly, to a system for applying a process liquid, e.g., a photoresist.

2. Description of the Related Art

A photoresist coating system is employed in a semiconductor device manufacturing process. As indicated in U.S. Pat. No. 5,061,144, this system usually comprises an adhesion process chamber, a pre-bake chamber, a cooling chamber, and a resist coating chamber. In the adhesion process chamber, in order to improve the adhesion properties between a semiconductor wafer as a target substrate and a resist film, the wafer surface is subjected to a hydrophobic process. In the pre-bake chamber, the solvent remaining in the resist coated on the wafer is heated to evaporate. In the cooling chamber, the wafer heated in the pre-bake chamber is cooled. In the resist coating chamber, a resist solution is coated, by rotation, on the surface of the wafer which is cooled to a predetermined temperature in the cooling chamber.

These process chambers are arranged along a wafer convey path, and loading and unloading of the wafers to and from the respective process chambers are performed by a convey robot that moves on the wafer convey path. The convey robot has a travel block that travels on the convey path, and a handling arm supported on the travel block.

Another convey robot is also developed which has a pair of upper and lower handling arms supported by a travel block and driven independently of each other. In this case, one arm is used for taking out a wafer, and the other arm is used for inserting a wafer, so that wafers can be efficiently transferred.

In this system, the thickness and quality of the resist film sometimes vary depending on the processing states. In a resist coating and developing system additionally having a developing chamber, the developing speed sometimes varies depending on the processing states. These variations in thickness and quality of the resist films and in developing speed decrease the yield of semiconductor devices as products.

SUMMARY OF THE INVENTION

It is an object of the present invention to provide a liquid application system which can control, with a high precision, the thickness and quality of a film formed on the target substrate by the system, or the degrees of physical and chemical treatments performed for a target substrate with a film formed by the system.

The present inventors made a study concerning the variations in thickness and quality of the resist film and in developing speed of conventional resist coating and developing systems. It was found out that these variations are caused by variations in wafer temperature during processing, as one of reasons.

This will be described taking a resist coating step as an example. Before the resist coating step, in order to set its temperature in advance, a wafer is cooled to a temperature close to the preset temperature in a cooling chamber. However, in a step of transferring the wafer from the cooling chamber to a resist coating chamber, the temperature of the wafer becomes sometimes largely different from the preset temperature. This may be caused since the wafer is thermally influenced by the handling arm between the cooling chamber and the resist coating chamber.

For example, in the pre-bake, cooling, and resist coating chambers, the temperature of the wafer is set to about 90°, 23°, and 23° C., respectively. Accordingly, if the handling arm receives a wafer pre-baked in the prebake chamber and then immediately handles a wafer cooled in the cooling chamber, the latter wafer receives a large heat energy from the handling arm. The wafer is also thermally influenced between the cooling chamber and the resist coating chamber by the atmospheres outside the process chambers.

In order to solve this problem, according to the present invention, there is provided a system for applying a process liquid on a target substrate, comprising:

a loading section where a container for storing a plurality of target substrates is placed;

an unloading section where a container for storing a plurality of target substrates is placed;

a convey path, connected to the loading and unloading sections, for conveying the substrate;

a first process chamber arranged along the convey path and having therein a first process section for processing the substrate at a first temperature;

a second process chamber arranged along the convey path and having therein a second process section for applying a process liquid on the substrate at a second temperature, the second process chamber being set to have an atmosphere of a temperature substantially the same as the second temperature, and the first and second temperatures being substantially different from each other;

a temperature adjusting table, arranged in the second process chamber, for placing the substrate thereon for a predetermined period of time, thereby setting the substrate to have a temperature substantially the same as the second temperature, the temperature adjusting table being arranged to be separated from the second process section;

first conveying means for conveying the substrate among the loading section, the unloading section, the first process chamber, and the second process chamber along the convey path; and second conveying means for conveying the substrate from the temperature adjusting table to the second process section, the second conveying means being arranged in the second process chamber.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 4 is a schematic plan view showing a manner of conveying a wafer in the main process chamber;

FIG. 5 is a schematic side view showing an operation of transferring the wafer from an arm of a convey robot to the cooling section;

FIG. 6 is a schematic side view showing an operation of transferring the wafer from the cooling section to the convey member of the main process chamber;

DETAILED DESCRIPTION OF THE PREFERRED EMBODIMENTS

Figure 1:
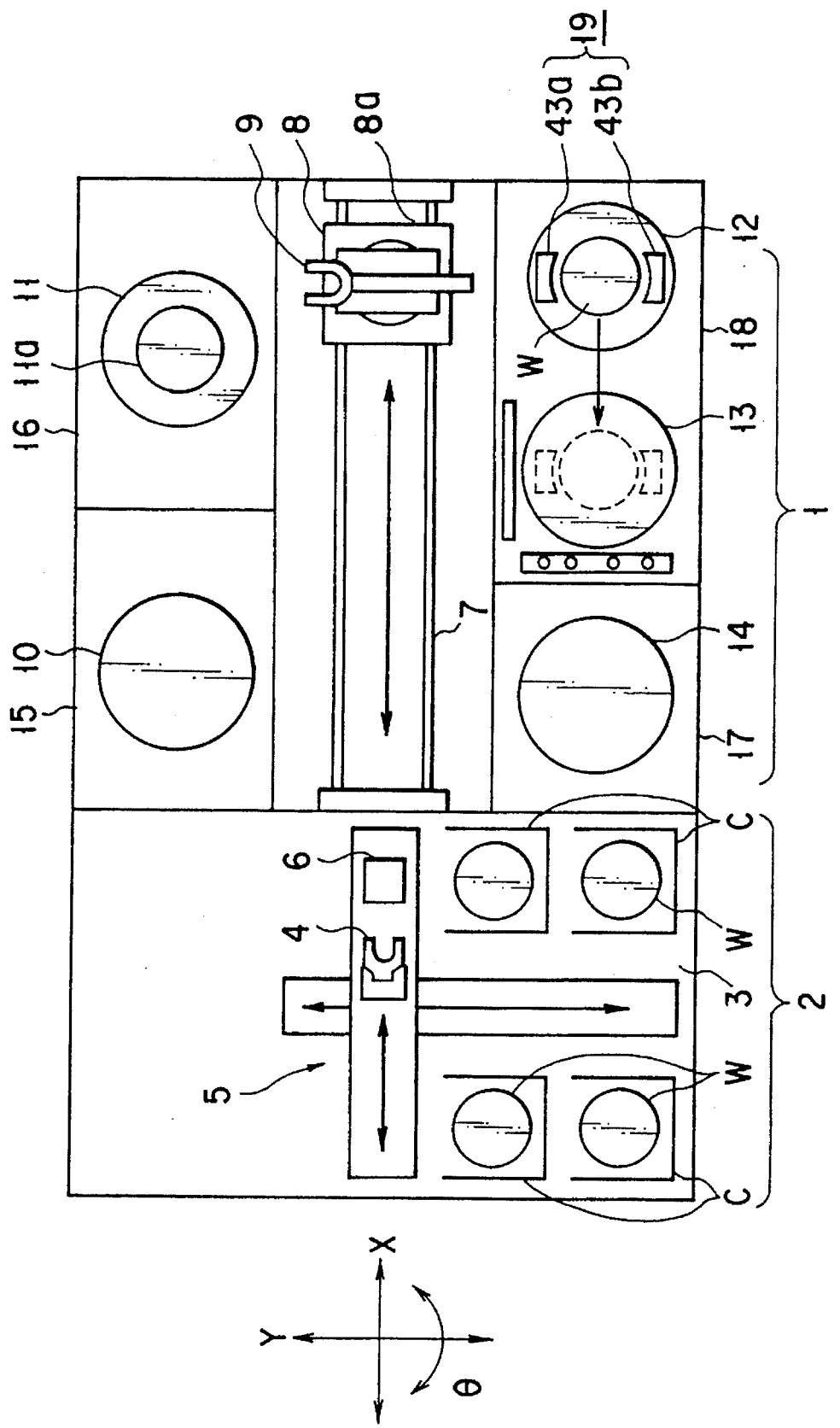
FIG. 1 is a schematic plan view showing a resist coating system according to an embodiment of the present invention.

As shown in FIG. 1, a photoresist coating system according to an embodiment of the present invention has a process unit 1 and a loading/unloading unit 2. The process unit 1 has a plurality of process sections for performing several types of processes for a semiconductor wafer W as the target substrate. The loading/unloading unit 2 automatically loads and unloads the wafer w to and from the process unit 1.

The loading/unloading unit 2 has a placing section 3 for placing thereon four wafer carriers C in which wafers W before or after processing are stored. The unit 2 further has an arm 4 for holding, by vacuum-chucking, the wafer W. The arm 4 is driven by a moving mechanism 5 in the X, Y (horizontal), Z (vertical), and θ (rotational) directions. The unit 2 further has an alignment stage 6, with which the wafer W is aligned and transferred from and to the process unit 1.

The process unit 1 is formed with a convey path 7 extending from the alignment stage 6 in the X direction. A convey robot 8 is movably disposed along the convey path 7. The convey robot 8 has a travel block 8a that moves on the convey path 7, and a pair of upper and lower handling arms 9 that are supported to be movable in the Y, z, and θ directions with respect to the travel block 8a. The pair of upper and lower handling arms 9 can be driven independently of each other so that even when a plurality of wafers W are to be processed in a concurrent manner, they can be conveyed efficiently.

An adhesion process section 10 and a pre-bake section 11 are arranged on one side of the convey path 7. In the adhesion process section 10, the surface of the wafer w is subjected to a hydrophobic process in order to improve the adhesion properties between the wafer W and the resist. In the pre-bake section 11, a solvent remaining in the resist coated in the wafer W is heated to evaporate. The pre-bake section 11 has a hot plate 11a for heating the wafer W. The wafer W is heated to 90° C. or more by the hot plate 11a.

A cooling section 12, a resist coating section 13, and a cover film coating section 14 are arranged on the other side of the convey path 7. In the cooling section 12, the heated wafer W is cooled before coating the resist on it. In the resist coating section 13, the resist is coated on the surface of the wafer W. In the cover film coating section 14, e.g., a cover film for Contrast Enhanced Lithography (CEL) is coated on the resist film formed on the wafer W so that irregular light reflection during exposure is prevented.

Of the process sections 10 to 14, the adhesion process section 10, the pre-bake section 11, and the cover film coating section 14 are separately arranged in respective process chambers 15 to 17. However, the cooling section 12 and the resist coating section 13 are arranged in a common main process chamber 18. A dedicated convey member 19 for conveying the wafer W between the cooling section 12 and the resist coating section 13 is provided in the process chamber 18.

In this embodiment, the process unit 1 does not include a developing section. However, a developing section can be incorporated in the process unit 1 together with the resist coating section 13. Alternatively, a developing section may be separately disposed adjacent to the process unit 1. Furthermore, the resist coating section 13 may be replaced by a developing section, and the process unit 1 may be used as a developing unit. A developing section and a process unit incorporating it are described in U.S. Pat. No. 5,275,658 invented by the same inventor as that of the present invention and issued on Jan. 4, 1994, the teachings of which are hereby incorporated by reference.

In the resist coating system according to the embodiment of the present invention, a non-processed wafer W is picked up from a carrier C and placed on the alignment stage 6 by the arm 4 of the loading/unloading unit 2. Subsequently, the wafer W on the alignment stage 6 is held by one handling arm 9 of the convey robot 8 and conveyed to the respective process chambers 15 to 18 so that it is sequentially processed by the respective process sections 10 to 14. The wafer W after processing is returned to the alignment stage 6 by one handling arm 9, and stored in the carrier C by the arm 4.

Figure 2:
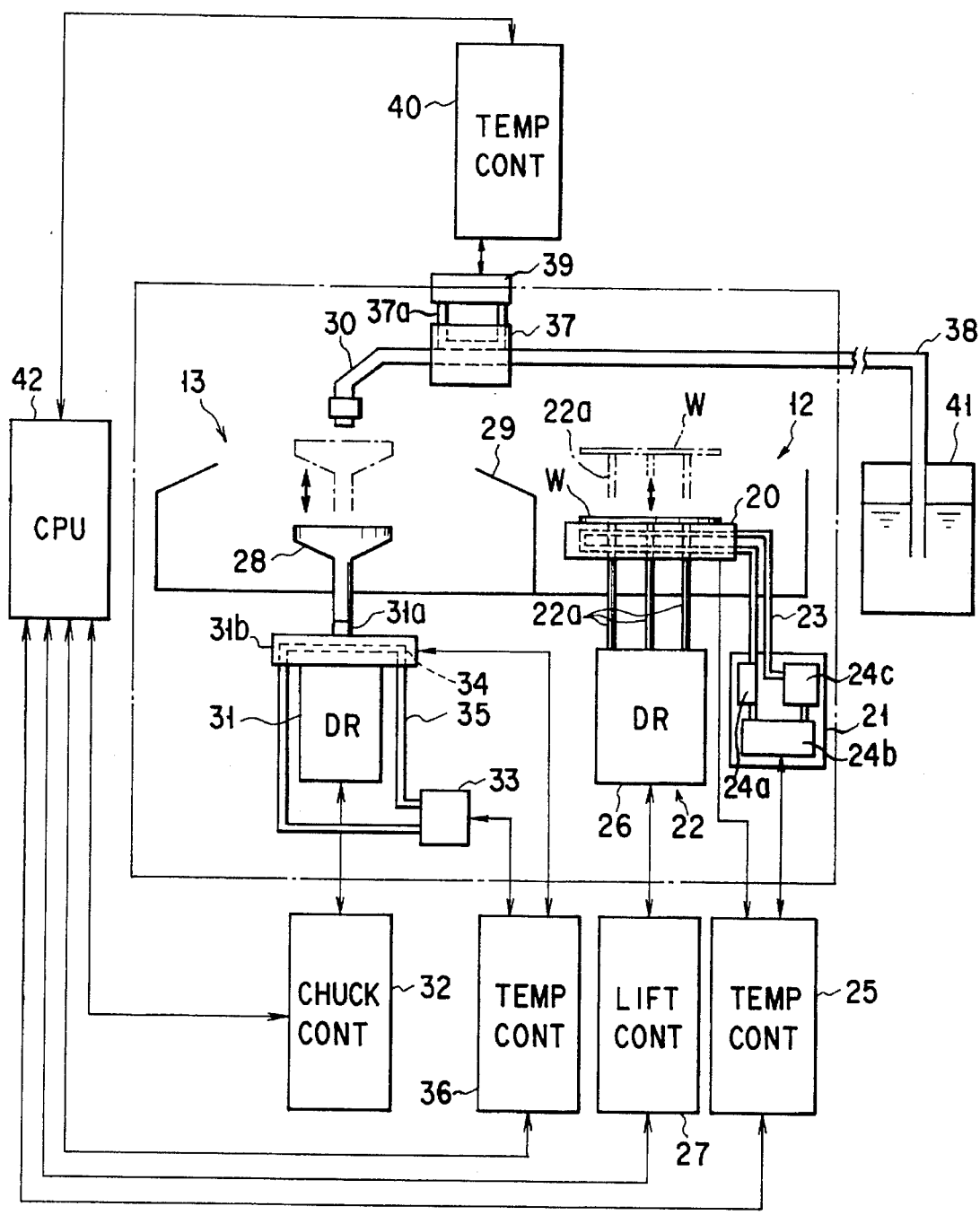
FIG. 2 is a schematic side view showing a cooling section and a coating section arranged in a common main process chamber.

FIG. 2 shows the cooling section 12 and the resist coating section 13 arranged in the main process chamber 18. The interior of the main process chamber 18 is set at room temperature of about 23° C. which is substantially common both for the cooling section 12 and the resist coating section 13.

As shown in FIG. 2, the cooling section 12 has a disk-like cooling plate 20 for placing the wafer W thereon. The temperature of the cooling plate 20 is adjusted by heat exchange with a constant-temperature water flowing therethrough. A circulation pipe 23, which is connected to a constant-temperature water circulator 21, is incorporated in the cooling plate 20. The circulator 21 includes a circulation pump 24a, a heat exchanger 24b, e.g. Peltlet element, and a water tank 24c, which are arranged along the pipe 23. The temperature of the constant-temperature water flowing through the cooling plate 20 is controlled by a temperature controller 25. Hence, the temperature of the cooling plate 20 is controlled to, e.g., about 23° C.

A wafer lifter 22 for moving the wafer upward (to remove it from the cooling plate 20) and downward (to place it on the cooling plate 20) is combined with the cooling plate 20. The wafer lifter 22 has three wafer support pins 22a that can be moved upward and downward vertically through the cooling plate 20. The wafer support pins 22a are simultaneously driven by a driving member 26, and their operations are controlled by a controller 27.

The resist coating section 13 has a spin chuck 28 for holding, by vacuum-chucking, the wafer W, and horizontally rotating the wafer W. The spin chuck 28 is surrounded by a cup 29 forming a processing space therein and having a temperature control function. The resist coating section 13 further has a nozzle 30 for supplying a photoresist in a liquid state to the surface of the wafer W. The nozzle 30 is moved between a supply position above the spin chuck 28 and a retreat position shown in FIG. 4 by an arm 57.

The lower end portion of the spin chuck 28 is fixed to a rotary shaft 31a of a chuck driving member 31 which rotates the spin chuck 28 and the wafer W at a predetermined high speed. The chuck driving member 31 can vertically move the spin chuck 28 while rotation of the spin chuck 28 is stopped. The vertical movement and rotation of the spin chuck 28 are controlled by a controller 32.

The temperature of the mount flange 31b is adjusted by heat exchange with a constant-temperature water flowing through a channel 34 formed in the flange 31b. A constant-temperature water circulator 33 is connected to the channel 34 via a circulation pipe 35. The circulator 33 has a structure the same as that of the circulator 21. The mount flange 31b prevents heat generated by the driving member 31 from being transmitted to the spin chuck 28 and thus to the wafer W through the rotary shaft 31a. The temperature of the constant-temperature water flowing through the flange 31b is controlled by a temperature controller 36. Hence, the temperature of the spin chuck 28 is also controlled to, e.g., about 23° C.

The resist supply nozzle 30 is connected through a pipe 38 to a resist solution bottle 41 which is provided with a solution supply member (not shown). A heat exchanger 37 is arranged on the pipe 38 for adjusting the resist temperature. The heat exchanger 37 is provided with a circulation pipe 37a arranged adjacent to the resist pipe 38 for heat exchange. The pipe 37a is connected to a constant-temperature water circulator 39 which has a structure the same as that of the circulator 21. The temperature of a constant-temperature water flowing through the pipe 37a is controlled by a temperature controller 40. The temperature of the resist supplied to the wafer W is adjusted to, e.g., 23° to 24.5° C.

The above temperature controllers 25, 36, and 40, the lifter controller 27, and the chuck controller 32 are controlled by a CPU 42, that centrally controls the entire coating system including the loading/unloading unit 2, in accordance with a predetermined program. CPU 42 also controls the operation of the convey robot 8 along the convey path 7 in association with the convey member 19 provided in the main process chamber 18.

Figures 3A, 3B:
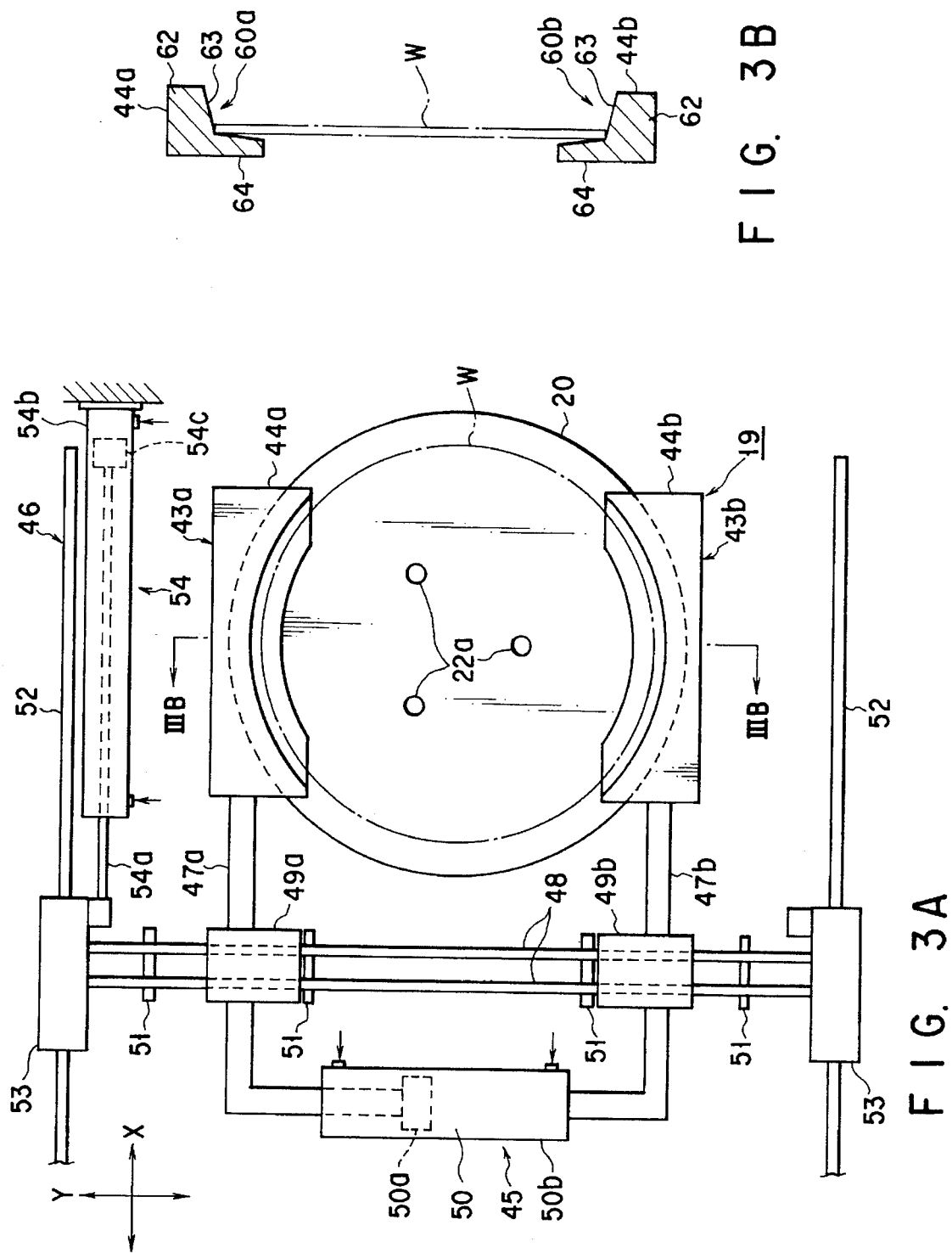
FIG. 3A is a schematic plan view showing a convey member provided adjacent to the cooling and coating sections.
FIG. 3B is a sectional view taken along the line IIIB—IIIB of FIG. 3A.

FIG. 3A is a schematic plan view showing the convey member 19 provided in the main process chamber 18, and FIG. 3B is a sectional view taken along the line IIIB—IIIB of FIG. 3A.

The convey member 19 has a pair of arms 43a and 43b for clamping the wafer W when the wafer W is to be conveyed between the cooling section 12 and the resist coating section 13. The arms 43a and 43b are opened and closed in the Y direction by an arm open/close mechanism 45. The arms 43a and 43b are also reciprocally moved between the cooling plate 20 and the spin chuck 28 by an arm moving mechanism 46 in a direction to convey the wafer W, i.e., in the X direction. The arm open/close mechanism 45 and the arm moving mechanism 46 are arranged at the upper portion in the process chamber 18.

The arms 43a and 43b have a pair of holders 44a and 44b for clamping the wafer W by engaging with its two end portions. The holders 44a and 44b are horizontally supported by support rods 47a and 47b to be parallel to each other in the X direction.

The holders 44a and 44b respectively have arcuated holding members 60a and 60b, that are symmetric to each other, on their inner sides. Each of the arcuated holding members 60a and 60b has a main body 62 and a flange 64, and its section has a substantially L shape. An arcuated side surface 63 to be engaged with the side surface of the wafer W is formed on the inner side of the main body 62. As shown in FIG. 3B, the arcuated side surface 63 is tapered to open upward. The flange 64 extends from the lower portion of the main body 62 in the inner lateral direction and is engaged with the bottom surface of the wafer W. The upper surface of the flange 64 is tapered downward from the main body 62 inwardly.

The support rods 47a and 47b are fixed to blocks 49a and 49b, respectively. The blocks 49a and 49b are supported to be slidable along guides 48 extending in the Y direction. The guides 48 are provided with a plurality of stoppers 51 that abut against the blocks 49a and 49b to regulate the range of their movement in the Y direction.

End portions of the support rods 47a and 47b on sides opposite to the holders 44a and 44b are bend inwardly, and one of them is connected to a piston 50a of a driving cylinder 50 of the arm open/close mechanism 45 while the other one of them is connected to a cylinder box 50b. A double-acting air cylinder is used as the cylinder 50. When air is supplied to and discharged from two pressure chambers in the cylinder body partitioned by the piston 50a, the cylinder length is changed, and the arms 43a and 43b are opened and closed.

The arm moving mechanism 46 for moving the arms 43a and 43b in the X direction has a pair of guides 52 provided on the two sides of the main process chamber 18 in the X direction. A linear bearing 53 is slidably supported on each guide 52. The guides 48 extending in the Y direction are provided to extend between the linear bearings 53.

A driving cylinder 54 extending in the x direction is connected to one linear bearing 53. A cylinder box 54b of the cylinder 54 is mounted to the stationary frame of the process chamber 18, and a piston rod 54a thereof is connected to this linear bearing 53. An elongated double-acting air cylinder having a stroke length corresponding to the range of movement of the arms 43a and 43b is used as the driving cylinder 54. When air is supplied to and discharged from two pressure chambers in the cylinder box 54b partitioned by a piston head 54c of the cylinder 54, the cylinder length is changed, and the arms 43a and 43b are moved between the cooling section 12 and the resist coating section 13.

A controller for supplying and discharging air to and from the driving cylinders 54 and 50, and controlling movement and opening/closing of the arms 43a and 43b, is incorporated in the CPU 42 together with the controller of the convey robot 8. The movement of the arms 43a and 43b and the movement of the convey robot 8 are controlled in association with each other in accordance with a program stored in the CPU 42 in advance.

The function of the resist coating system according to the present invention will be described.

First, the wafer W is handled by the pair of handling arms 9 and passed through the process chamber 15 so as to be subjected to adhesion processing. Subsequently, the wafer W is held by one handling arm 9 and transferred to a portion above the cooling plate 20 in the process chamber 18 through an opening portion of the process chamber 18. In synchronism with this carry-in of the wafer W, as shown in FIG. 5, the three pins 22a of the lifter 22 are moved upward. Then, this handling arm 9 is moved downward to transfer the wafer W onto the pins 22a.

After this handling arm 9 is retreated from the process chamber 18, the pins 22a are moved downward to place the wafer W on the cooling plate 20. In this state, the wafer W is cooled for a predetermined period of time, e.g., for 30 seconds. After cooling, the wafer support pins 22a are moved upward again to move the wafer W to the height upon the carry-in.

At this time, as shown in FIGS. 4 and 6, at the upper position of the wafer W, the arms 43a and 43b wait such that the distance between the end portions of the flanges 64 of their holding members 60a and 60b is larger than the diameter of the wafer W, i.e., in the open state. After the wafer W is moved upward, the arms 43a and 43b are moved close to each other by the operation of the arm open/close mechanism 45 in order to hold the wafer W. Subsequently, the pins 22a are moved downward, and the arms 43a and 43b are moved to the resist coating section 13 by the operation of the arm moving mechanism 46.

Figure 7:
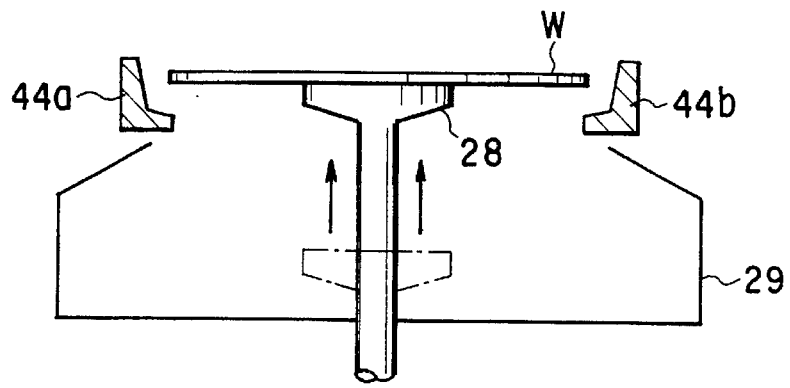
FIG. 7 is a schematic side view showing an operation of transferring the wafer from the convey member of the main process chamber to the coating section.

The wafer W is conveyed to above the cup 29, and as shown in FIG. 7, the chuck 28 is moved upward to project from the cup 29. The chuck 28 chucks the lower surface of the wafer W held by the arms 43a and 43b. The arms 43a and 43b are then retreated such that they are separated from each other by a distance larger than the diameter of the wafer W, i.e., in the open state, and the chuck 28 is moved downward to house the wafer W in the cup 29.

After the arms 43a and 43b are moved to the cooling plate 20, the nozzle 30 is moved to above the cup 29, and the resist solution is dropped onto the wafer W simultaneously with the start of rotation of the chuck 28. The resist is uniformly applied on the entire upper surface of the wafer W by rotation of the wafer w done through the chuck 28. After this coating process is performed for a predetermined period of time, e.g., for 40 seconds, the chuck 28 stops rotation and is moved upward to lift the wafer W above the cup 29.

Figure 8:
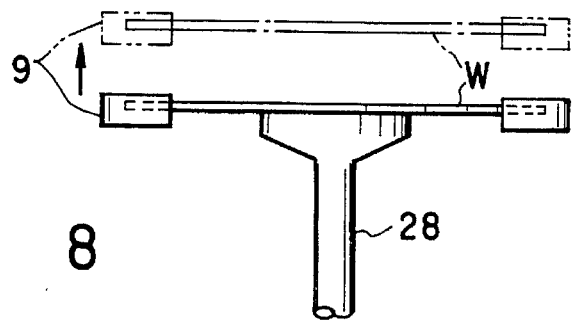
FIG. 8 is a schematic side view showing an operation of transferring the wafer from the coating section to the arm of the convey robot.

Subsequently, one of the handling arms 9 of the convey robot 8 is moved to below the wafer w supported by the chuck 28. When the chuck 28 releases chucking of the wafer W, this handling arm 9 is moved upward, as shown in FIG. 8, or the chuck 28 is moved downward, so that the wafer W is transferred from the chuck 28 to this arm 9. The wafer W is taken out of the process chamber 18 by this arm 9. Thereafter, the wafer W is conveyed to the following process chamber 16 and pre-baked. Then, the wafer W is conveyed to the process chamber 17 as required, and a cover film, e.g., a CEL film, is formed on the wafer W.

In this manner, the cooling section 12 and the resist coating section 13 are arranged in the same process chamber 18, and the wafer W is conveyed from the cooling section 12 to the resist coating section 13 by the convey member 19 dedicated to the process chamber 18. Meanwhile, among the process chambers 15 to 18, transfer of the wafer W is performed by the pair of handling arms 9. Thus, the wafer W can be moved from the cooling section 12 to the resist coating section 13 without being thermally influenced by the handling arms 9. Since the cooling section 12, the resist coating section 13, and the convey member 19 are arranged in the same process chamber 18, temperature controllability of the atmosphere in the process chamber 18 is also improved. Accordingly, among a plurality of wafers W, the temperature of the wafers W during resist solution coating can be reliably maintained at a constant value, and thus the thickness and quality of the coated film become constant, thereby increasing the yield of the products.

Sometimes in the conventional system, for example, an arm handles a wafer that has been processed by the pre-bake section having a processing temperature different from that of the resist coating section by as large as 60° C. or more, and thereafter this arm immediately handles another wafer supplied from the cooling section. This gives a large thermal influence to the cooled wafer and thus decreases the yield of products.

Figure 9:
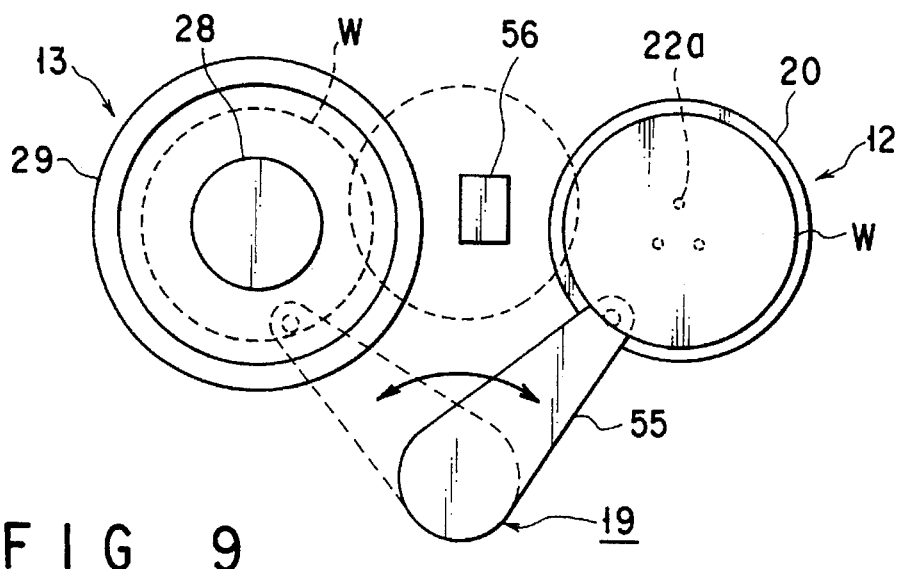
FIG. 9 is a schematic plan view showing a modification of the convey member according to the present invention.

The convey member 19 moves and opens/closes the arms 43a and 43b with the cylinders 50 and 54. However, the driving means is not limited to this and, e.g., a motor can be used as the driving means. The overall structure of the convey member 19 is not limited to the one in which the arms 43a and 43b linearly move in the process chamber. For example, as shown in FIG. 9, a convey member 19 may be formed of a horizontally rotatable chuck arm 55 in the vicinity of the cooling section 12 and the resist coating section 13, and the wafer W may be conveyed from the cooling section 12 to the resist coating section 13 by supporting or vacuum-chucking the peripheral portion of the lower surface of the wafer W with the chuck arm 55. In this case, however, a positioning member 56 may be separately needed to precisely position the wafer w with respect to the chuck 28.

The present invention can be applied to a system other than the resist coating system of the embodiment described above, e.g., a developing solution coating system, a resist coating and developing system, an etching solution coating system, and a magnetic solution coating system. The present invention can process a substrate other than a semiconductor wafer, e.g., an LCD substrate. The present invention can be applied to a case wherein a substrate is processed with conditions largely different from each other among a plurality of process chambers in the same processing system. From this point of view, the present invention can be applied to a processing system other than the coating or liquid applying system.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A system for applying a process liquid on a target substrate, comprising:

a loading section where a container for storing a plurality of target substrates is placed;

an unloading section where a container for storing a plurality of target substrates is placed;

a convey path, connected to said loading and unloading sections, for conveying the substrate;

a first process chamber arranged along said convey path and having therein a first process section for processing the substrate at a first temperature;

a second process chamber arranged along said convey path and having therein a second process section for applying a process liquid on the substrate at a second temperature, which is lower than said first temperature;

a support means for supporting the substrate in said second process section;

an applying means for applying said process liquid on the substrate in said second process section;

a cooling plate, on which the substrate is placed, arranged separately from and adjacent to said support means and disposed in said second process chamber for adjusting a temperature of the substrate substantially to said second temperature before the substrate is conveyed to said support means;

first conveying means for conveying the substrate among said loading section, said unloading section, said first process chamber, and said second process chamber along said convey path;

second conveying means formed independent of said first conveying means, disposed in and dedicated to said second process chamber for conveying only the substrate cooled down to the second temperature from said cooling plate to said second process section;

a partition means disposed in said second process chamber for isolating said second process section from said cooling plate; and a driving means for moving said support means relative to said partition means in a vertical direction.

2. A system according to claim 1, further comprising control means for controlling said first and second conveying means in association with each other.

3. A system according to claim 2, wherein said second process chamber is set to have an atmosphere of a temperature substantially the same as the second temperature.

4. A system according to claim 3, wherein said support means comprises a spin chuck for holding thereon and rotating the substrate.

5. A system according to claim 4, wherein said partition means comprises a cup surrounding said spin chuck.

6. A system according to claim 5, wherein said spin chuck is moved by said driving means upward and downward between a process position in said cup and a substrate transfer position above said cup.

7. A system according to claim 6, further comprising a plurality of lift pins for moving upward and downward the substrate with respect to said cooling plate.

8. A system according to claim 7, wherein said first process section comprises a hot plate for heating the substrate.

9. A system according to claim 4, wherein said applying means comprises a nozzle for supplying the process liquid onto the substrate.

10. A system according to claim 9, wherein said nozzle is movable between a supply position above said chuck and a retreat position where said nozzle is distant from said chuck.

11. A system according to claim 10, wherein said nozzle supplies a photoresist as the process liquid.

12. A system according to claim 5, wherein said cup has a temperature control function.

13. A system according to claim 1, wherein said loading and unloading sections are integrally formed as a loading/unloading unit.

14. A system according to claim 13, wherein said loading/unloading unit comprises third conveying means formed independent of said first and second conveying means.

15. A system according to claim 1, wherein said second conveying means comprises a pair of arms for clamping and conveying the substrate.

16. A system according to claim 15, wherein said pair of arms comprise holding members opposing each other, and each of said holding members comprises a first portion to be engaged with a side surface of the substrate and a second portion to be engaged with a lower surface of the substrate.

17. A system according to claim 16, wherein said pair of arms linearly convey the substrate from said cooling plate to said support means.

18. A system according to claim 1, wherein said second conveying means comprises an arm for holding, by vacuum-chucking, a lower surface of the substrate.

* * * * *